US011081368B2

(12) United States Patent
Imayoshi et al.

(10) Patent No.: US 11,081,368 B2
(45) Date of Patent: Aug. 3, 2021

(54) METHOD OF DICING WIRING SUBSTRATE, AND PACKAGING SUBSTRATE

(71) Applicant: TOPPAN PRINTING CO., LTD., Tokyo (JP)

(72) Inventors: Koji Imayoshi, Tokyo (JP); Yuki Nitta, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/865,905

(22) Filed: May 4, 2020

(65) Prior Publication Data

US 2020/0266077 A1 Aug. 20, 2020

Related U.S. Application Data

(60) Division of application No. 16/445,606, filed on Jun. 19, 2019, now Pat. No. 10,679,865, which is a
(Continued)

(30) Foreign Application Priority Data

Dec. 28, 2016 (JP) .............................. JP2016-256418

(51) Int. Cl.
*H01L 21/48* (2006.01)
*H01L 23/13* (2006.01)
(Continued)

(52) U.S. Cl.
CPC .......... *H01L 21/4857* (2013.01); *H01L 23/12* (2013.01); *H01L 23/13* (2013.01);
(Continued)

(58) Field of Classification Search
CPC ..... H01L 21/4857; H01L 23/12; H01L 23/13; H01L 23/15; H01L 23/49822;
(Continued)

(56) References Cited

U.S. PATENT DOCUMENTS 5,111,033 A  5/1992  Fujita et al.
8,642,448 B2  2/2014  Lei et al.
(Continued)

FOREIGN PATENT DOCUMENTS

EP  0 357 088 A2  3/1990
JP  2009-239105 A  10/2009
JP  2015-201629 A  11/2015
JP  2015-231005 A  12/2015

OTHER PUBLICATIONS

International Searching Authority, "International Search Report," issued in connection with International Patent Application No. PCT/JP2017/046357, dated Apr. 3, 2018.
(Continued)

*Primary Examiner* — Binh X Tran
(74) *Attorney, Agent, or Firm* — Foley & Lardner LLP (57) ABSTRACT

The method of dicing a wiring substrate that includes a core substrate having a front surface and a rear surface at least one of which is provided with an adhesive layer and a rim pattern thereon. The adhesive layer is provided with a laminate that has wiring layers and insulating layers, laminating. The rim pattern is provided with the insulating layers laminated thereon. The method includes steps of forming separation grooves by removing portions of the insulating layers laminated on the rim pattern to expose the rim pattern; exposing at least one of the front and rear surfaces of the core substrate by dissolving and removing the rim pattern of the groove bottoms; and dicing the core substrate exposed at groove bottoms, along cutting margins each being smaller than a groove width of each of the groove bottoms.

20 Claims, 6 Drawing Sheets

Related U.S. Application Data continuation of application No. PCT/JP2017/046357, filed on Dec. 25, 2017.

(51) Int. Cl.
  *H01L 23/15* (2006.01)
  *H01L 23/498* (2006.01)
  *H01L 23/00* (2006.01)
  *H05K 3/46* (2006.01)
  *H05K 3/00* (2006.01)
  *H01L 23/12* (2006.01)

(52) U.S. Cl.
  CPC ........ *H01L 23/15* (2013.01); *H01L 23/49822* (2013.01); *H01L 23/562* (2013.01); *H05K 3/00* (2013.01); *H05K 3/46* (2013.01)

(58) Field of Classification Search
  CPC .......... H01L 23/562; H05K 3/46; H05K 3/00; H05K 3/0052
  See application file for complete search history.

(56) References Cited

U.S. PATENT DOCUMENTS

| | | |
|---|---|---|
| 2013/0183475 A1 | 7/2013 | Yoshida et al. |
| 2014/0327024 A1* | 11/2014 | Ishihara ................ H05K 1/056 |
| | | 257/98 |
| 2016/0027697 A1 | 1/2016 | Lei et al. |
| 2016/0135289 A1 | 5/2016 | Cho et al. |
| 2016/0365283 A1 | 12/2016 | Lei et al. |
| 2016/0368177 A1* | 12/2016 | Kasai ................ B29C 45/14655 |
| 2017/0221837 A1 | 8/2017 | Hedrick et al. |
| 2017/0250158 A1 | 8/2017 | Chinnusamy et al. |
| 2018/0096952 A1 | 4/2018 | Miccoli |
| 2018/0323128 A1 | 11/2018 | Dias et al. |

OTHER PUBLICATIONS

International Searching Authority, "Written Opinion," issued in connection with International Patent Application No. PCT/JP2017/046357, dated Apr. 3, 2018.

Extended European Search Report issued in corresponding European Application No. 17885790.0 dated Nov. 28, 2019.

\* cited by examiner

METHOD OF DICING WIRING SUBSTRATE, AND PACKAGING SUBSTRATE

CROSS-REFERENCE TO RELATED PATENT APPLICATIONS

The present application is a Divisional of U.S. patent application Ser. No. 16/445,606, filed on Jun. 19, 2019, which is a Bypass Continuation of International Patent Application No. PCT/JP2017/046357, filed on Dec. 25, 2017, which is based upon and claims the benefit of priority to Japanese Patent Application No. 2016-256418, filed on Dec. 28, 2016; the disclosures of which are incorporated herein by reference in their entireties.

TECHNICAL FIELD

The present invention relates to a method suitable for dicing a wiring substrate, and a packaging substrate formed by using this method.

BACKGROUND ART

Packaging substrates are obtained by cutting a large size wiring substrate into dices of a predetermined size. The large size wiring substrate is formed by laminating wiring layers and insulating layers on a core substrate.

Core substrates recently used for packaging substrates include ones which are made of materials exerting good electrical properties but having brittle cut surfaces when diced. When producing a wiring substrate, an insulating layer and a wiring layer are laminated a plurality of times on a core substrate. These insulating layers and wiring layers respectively have linear expansion coefficients different from that of the core substrate. It is known that this difference in linear expansion coefficient, being coupled with temperature change, increases difference in expansion between the insulating layers, the wiring layers and the core substrate, and generates stress in the outer periphery of the core substrate. If the material used for the core substrate is brittle, cracks may occur in the core substrate. In the case of a laminate including a glass substrate as a core substrate, if the glass substrate has a thickness of more than several tens of micrometers, the glass substrate may split at the end faces.

Cracks that have occurred in a core substrate may split the core substrate. Specifically, immediately after dicing or in the processing after dicing, the internal stress accumulated in the core substrate may be released from such cracks, causing splits in the direction in which the core substrate breaks.

As a dicing method not developing such cracks, for example, a metal layer is formed on a core substrate, at portions corresponding to the outer circumferential portions of packaging substrates, and, after dicing, the exposed metal layer is etched away to create a groove defined by the core substrate and the insulating layer. This groove can minimize the stress applied around the outer periphery of the core substrate. Thus, breakage of the core substrate is effectively decreased or even minimized with a simple configuration. (E.g., see PTL 1).

CITATION LIST

Patent Literature

PTL 1: JP 2015-231005 A.

SUMMARY OF THE INVENTION

Technical Problem

The method disclosed in PTL 1 uses a dicing blade to cut the metal layer formed on the core substrate. Therefore, clogging of the dicing blade that may occur may lower the cutting ability thereof, developing cracks at the end faces (cut surfaces) of the core substrate. Such cracks may occur in the end faces of the core substrate immediately after dicing.

The present invention aims to provide a method of dicing a wiring substrate, with which a packaging substrate can be formed without developing cracks or the like in the cut surfaces of the core substrate, and to provide a packaging substrate which enhances reliability even when used under high or low temperature environments.

Solution to Problem

To achieve the aim set forth above, a method according to an aspect of the present invention is a method of dicing a wiring substrate that includes a core substrate having at least one surface on which an adhesive layer and a rim pattern are formed. The adhesive layer is provided with a laminate that has at least one wiring layer and at least one insulating layer, alternating. The rim pattern is provided with the insulating layer laminated thereon. This method includes a step of forming separation grooves having respective groove bottoms where the rim pattern is exposed, by removing portions of the insulating layer laminated on the rim pattern; a step of exposing the core surface of the core substrate by dissolving and removing the rim pattern of the groove bottoms; and a step of dicing the core substrate exposed at the groove bottoms, along cutting margins each being smaller than a groove width of each of the groove bottoms.

A packaging substrate formed by using this method of dicing a wiring substrate has outer surfaces in the width direction of the packaging substrate. The outer surfaces each include an insulating side surface of the insulating layer, and a core step protruding in the width direction from the insulating side surface and including a cut surface as an end face of the core substrate.

Advantageous Effects of the Invention

The method of dicing a wiring substrate according to an aspect of the present invention enables formation of a packaging substrate without developing cracks or the like in the cut surfaces of the core substrate.

The packaging substrate according to an aspect of the present invention can be used with higher reliability even under high or low temperature environments.

DESCRIPTION OF REPRESENTATIVE EMBODIMENTS

With reference to the drawings, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

In the first embodiment set forth below, the term "packaging substrate" refers to a diced laminate. Also, the term "outer surface of packaging substrate" refers to an outer surface in the width direction perpendicular to the thickness direction of the substrate. Furthermore, the term "wiring substrate" refers to a wiring substrate before being diced, that is, packaging substrates in a state of being continuous.

[Configuration of Wiring Substrate]

Figure 1:
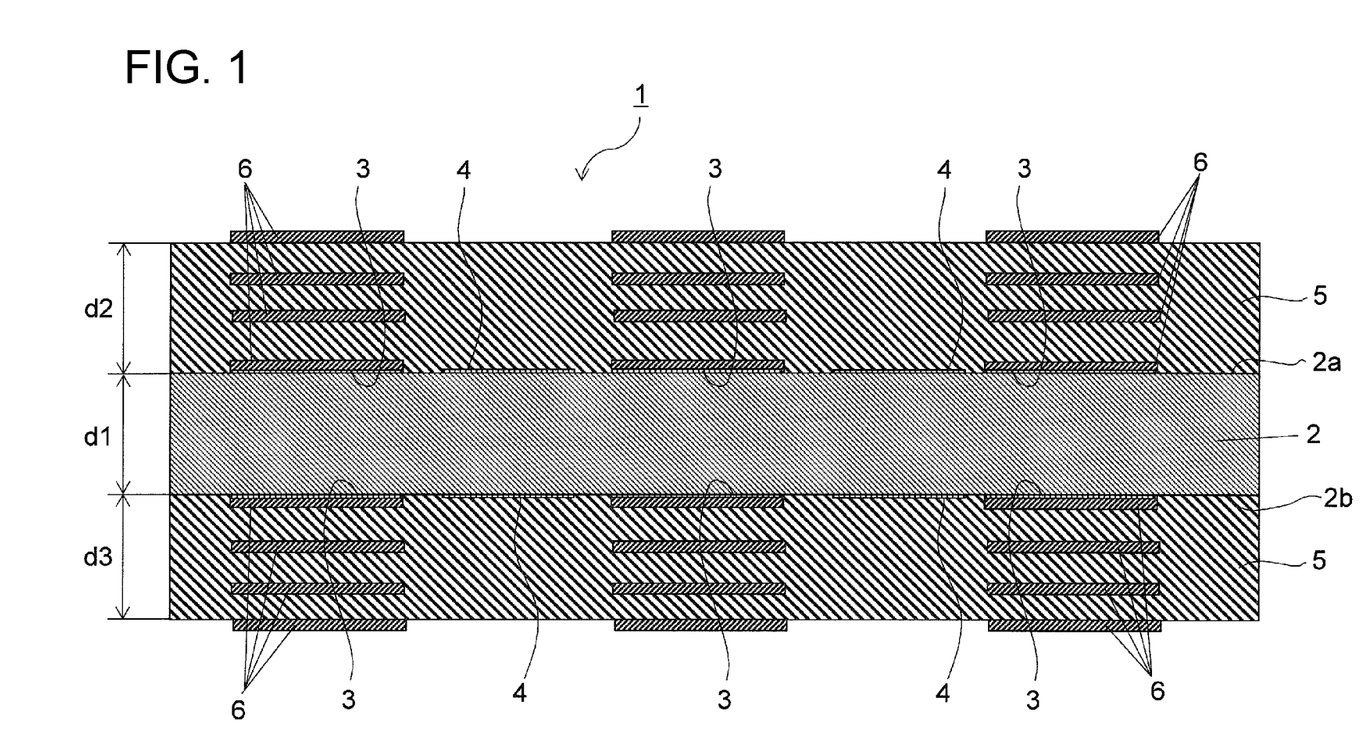
FIG. 1 is a cross-sectional view illustrating a configuration of a wiring substrate, according to an embodiment of the present invention.

FIG. 1 shows a wiring substrate 1 of a first embodiment. The wiring substrate 1 includes a core substrate 2, adhesive layers 3 respectively laminated on both surfaces of the core substrate 2 in the thickness direction, rim patterns 4 respectively laminated on both surfaces of the core substrate 2 in the thickness direction so as to be located differently from the adhesive patterns 3, insulating layers 5 covering surfaces of the respective rim patterns 4, and wiring layers 6 laminated a plurality of times on the respective adhesive layers 3 via the respective insulating layers 5.

Any material may be used for the core substrate 2 as long as the material improves electrical properties of the wiring board 1 and the packaging substrate 10, described later, obtained as a result of dicing the wiring substrate 1. Specific materials that can be used for the core substrate 2 may be brittle materials, such as glass substrates, silicon substrates, ceramic substrates, plastic plates, plastic tapes, and the like.

Glass substrates are preferable as materials for the core substrate 2. For example, the glass substrates may be soda-lime glass substrates, or aluminosilicate glass substrates. The glass substrate used for the core substrate 2 may be one whose surfaces have been treated using a method commonly used in the art. For example, the glass substrate may be one whose surfaces have been roughened, treated with hydrofluoric acid, or siliconized. The glass substrate used for the core substrate 2 may have surfaces on which respective underlayers (not shown) are formed. The core substrate 2 may preferably have a thickness d1 in the range of about 50 μm to 800 μm, although not limited thereto.

The wiring layers 6 are formed, for example, of chromium, copper, silver, tin, gold, tungsten, or alloys thereof, or electrically conductive resins, or the like. The wiring layers 6 may be thickly formed by plating, followed by forming wiring using a subtractive method or a semi-additive method, or may be formed by ink jetting, screen printing, or gravure offset printing. Preferably, a semi-additive method may be used. The wiring layers 6 may each be formed with a thickness, for example, in the range of 1 μm to 50 μm.

The adhesive layers 3 and the rim patterns 4 are each formed of a film, for example, of Ti, Cr, Ni, Cu or alloys thereof, or metallic peroxides, such as $ZnO_2$, produced by vacuum deposition, electroless plating, sol-gel solution coating, or other methods with a thickness of about 0.1 μm to 10 μm.

Each adhesive layer 3 exerts an effect of imparting adhesion between the wiring layer 6 and the core substrate 2. Each rim pattern 4 exerts an effect of imparting adhesion between the core substrate 2 and the insulating layer 5.

The insulating layers 5 may be formed using, for example, an epoxy resin-based material, an epoxy acrylate-based resin, a polyimide-based resin, a liquid crystal polymer-based resin, or the like. These insulating materials may each contain a filler. As the insulating material forming the insulating layers 5, an epoxy-containing resin having a linear expansion coefficient in the range of 7 ppm/K to 130 ppm/K is preferable because it is easily available in general. The insulating material may be a liquid material or a film material. When the insulating material is a liquid, the insulating layers 5 may be formed using a method, such as spin coating, die coating, curtain coating, roll coating, doctor blading, or screen printing which are commonly used in the art. When the insulating material is a film, the insulating layers 5 may be formed, for example, by vacuum lamination or roll lamination. The insulating layers 5 formed as described above may be cured by heating or light irradiation. The insulating layers 5 may be respectively formed with thicknesses d2 and d3 which are in the range of 2 μm to 200 μm.

[Method of Dicing Wiring Substrate]

Referring now to FIGS. 2 to 6, a method of forming a packaging substrate by dicing the wiring substrate 1 will be described.

Figure 2:
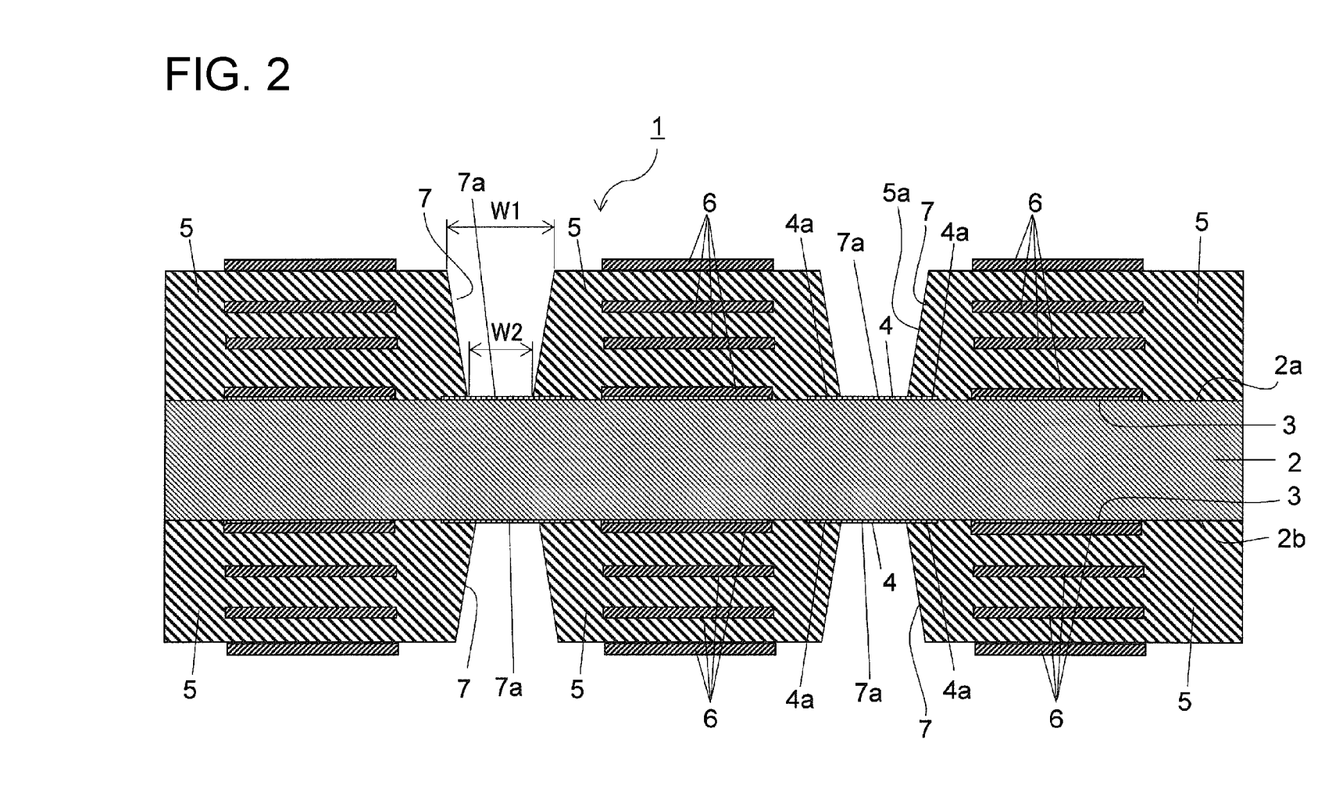
FIG. 2 is a diagram illustrating a process of forming separation grooves in a method of dicing a wiring substrate, according to an embodiment of the present invention.

First, as shown in FIG. 2, portions of the insulating layers 5 are removed in the thickness direction of the wiring substrate 1, in which the respective rim patterns 4 are laminated, to form separation grooves 7.

Each separation groove 7 is formed with a depth allowing the rim pattern 4 to be partially exposed at a groove bottom 7a thereof. Each rim pattern 4 has an edge 4a that is not exposed at the groove bottoms 7a. The edge 4a is adhered and interposed between the insulating layer 5 near the groove bottom 7a and a front surface 2a or a rear surface 2b of the core substrate 2.

Figure 6:
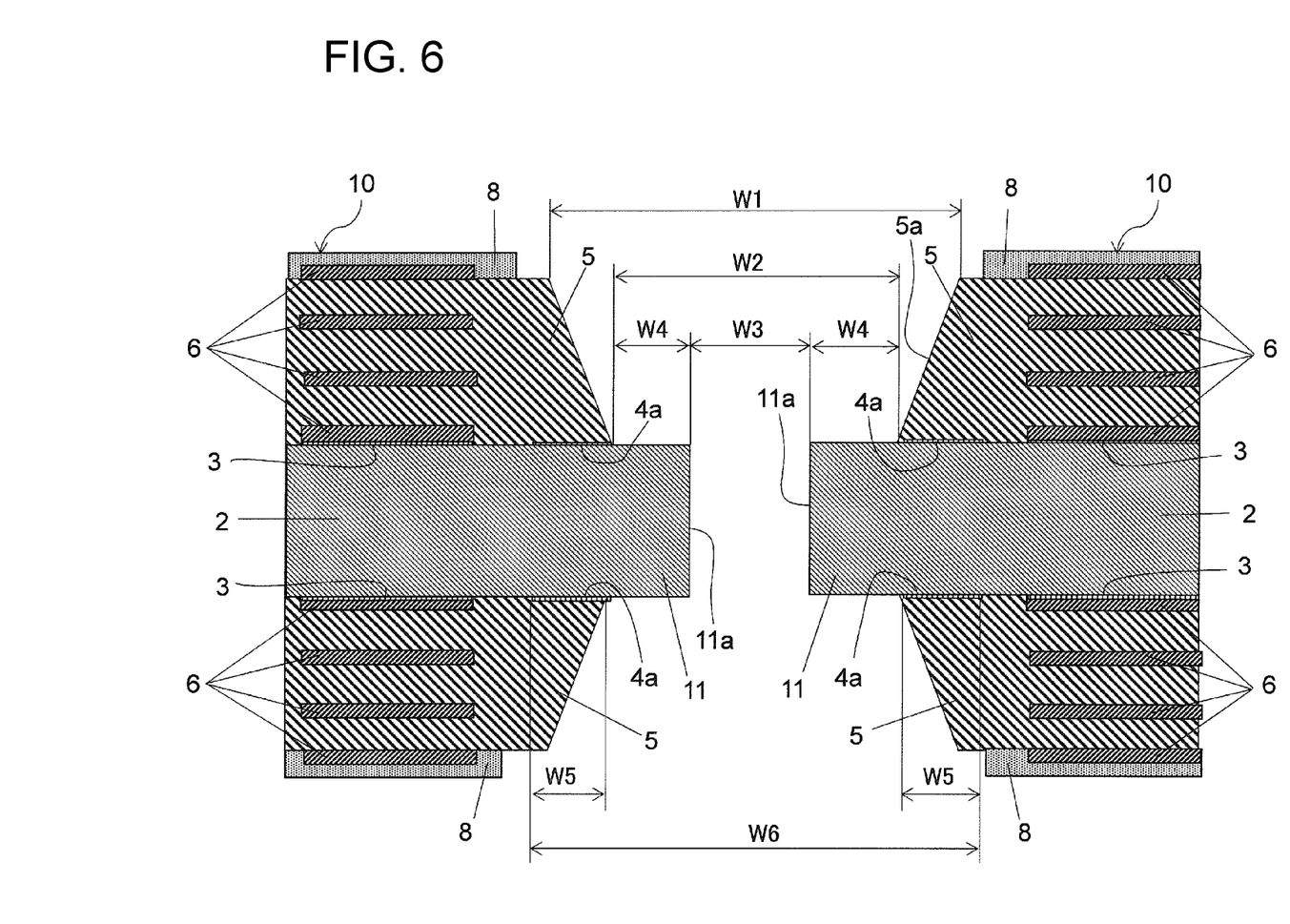
FIG. 6 is an enlarged view illustrating outer surfaces of packaging substrates, according to an embodiment of the present invention.

As can also be seen from FIG. 6, each separation groove 7 has a tapered cross section that has a groove width W1 at the opening of the insulating layer 5 and a groove width W2 at the groove bottom 7a. The groove width W1 is larger than the groove width W2 (W1>W2).

The separation grooves 7 are formed using UV laser processing, or using a $CO_2$ laser or a green laser. Thus, when the separation grooves 7 are formed by laser radiation, the rim patterns 4 residing at the groove bottoms 7a contribute to minimizing damage that would otherwise be caused on the front surface 2a and the rear surface 2b of the core substrate 2.

The separation grooves 7 formed on the front surface 2a of the core substrate 2 do not have to have the same groove widths W1 and W2 as those of the separation grooves 7 formed on the rear surface 2b. In the case where the front and rear surface sides are asymmetrically structured in terms of residual copper ratio of wiring or size of ground pattern, the difference in size of the groove widths W1 and W2 between the front and rear surfaces 2a and 2b may contribute to controlling the difference in stress therebetween caused by the insulating layers 5 and the wiring layers 6.

Figure 3:
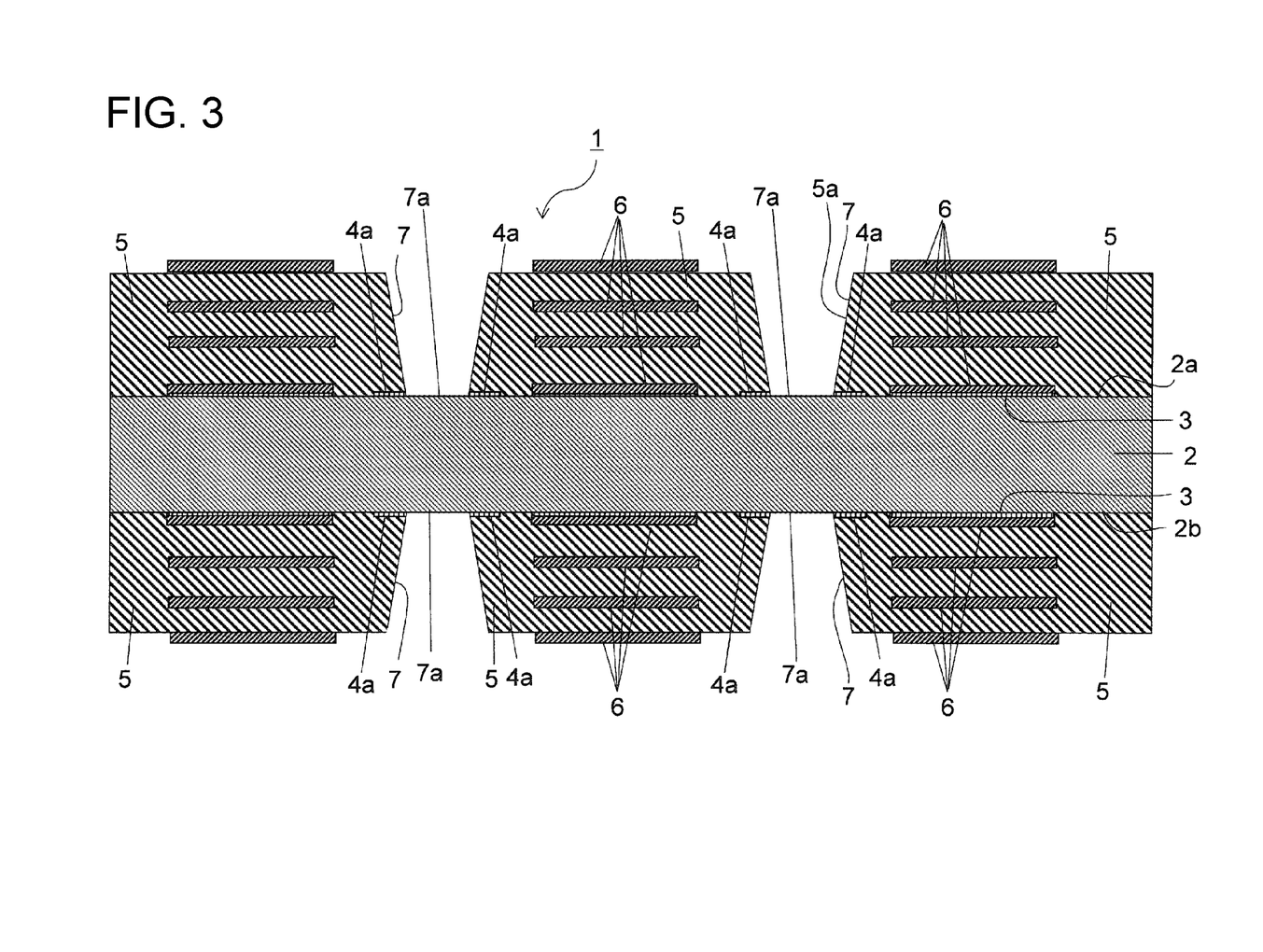
FIG. 3 is a diagram illustrating a process of exposing the core substrate at the bottoms of the separation grooves in a method of dicing a wiring substrate, according to an embodiment of the present invention.

Then, as shown in FIG. 3, each rim pattern 4 exposed at the groove bottoms 7a of the separation grooves 7 is dissolved and etched away to expose portions of the front surface 2a or the rear surface 2b of the core substrate 2 at the overall regions of the respective groove bottoms 7a.

Figure 4:
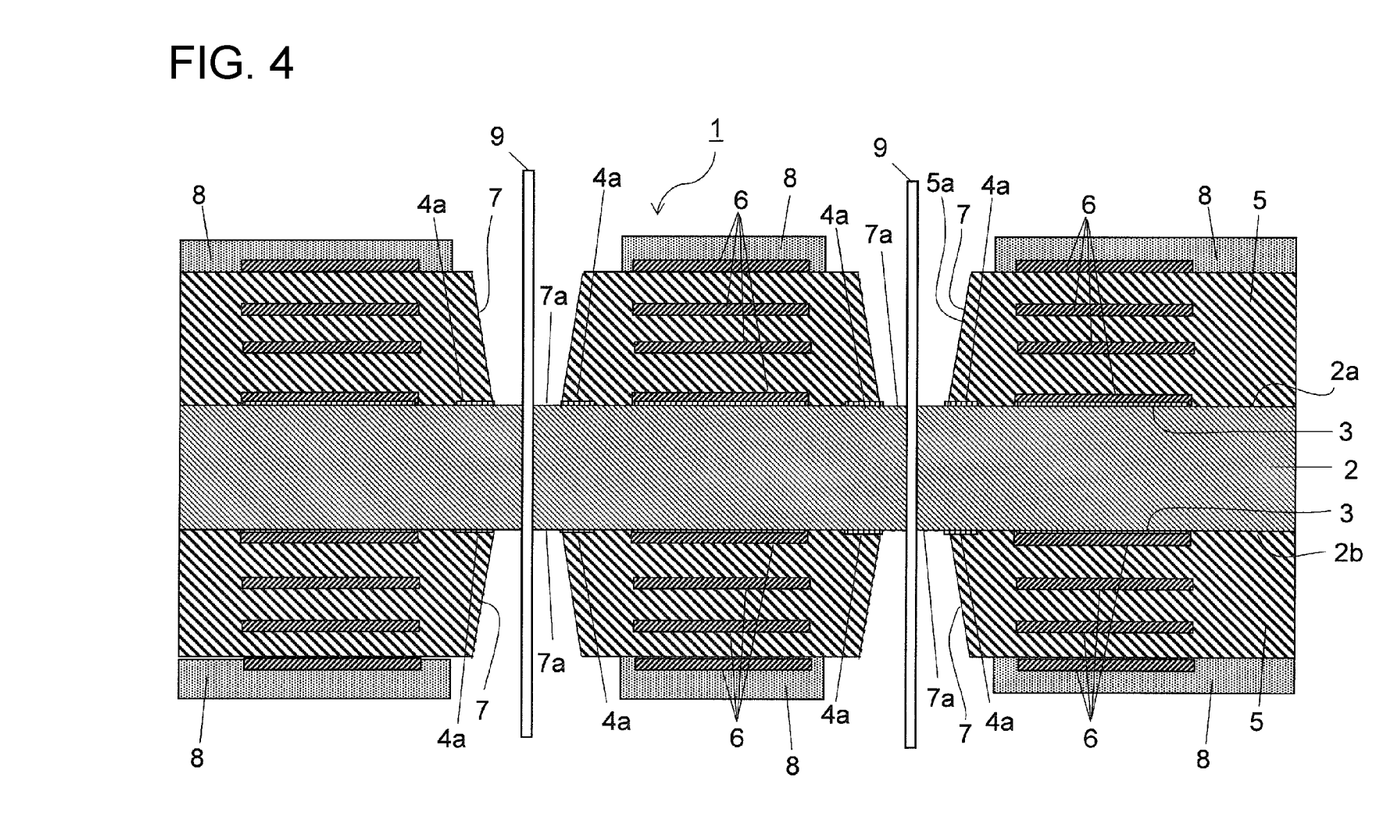
FIG. 4 is a diagram illustrating a process of cutting the exposed core substrate in a method of dicing a wiring substrate, according to an embodiment of the present invention.

Furthermore, as shown in FIG. 4, solder resist layers 8 are formed on the respective outermost wiring layers 6 of the core substrate 2 in the thickness direction.

Then, as shown in FIG. 4, the wiring substrate 1 is cut into dices by using a dicing blade 9 at center positions of the groove bottoms 7a of the respective grooves 7 in the width direction.

As shown in FIG. 6, there is provided a cutting margin W3 for the dicing blade 9. The cutting margin W3 is smaller than the groove width W1 of each separation groove 7 at the opening of the insulating layer 5.

Figure 5:
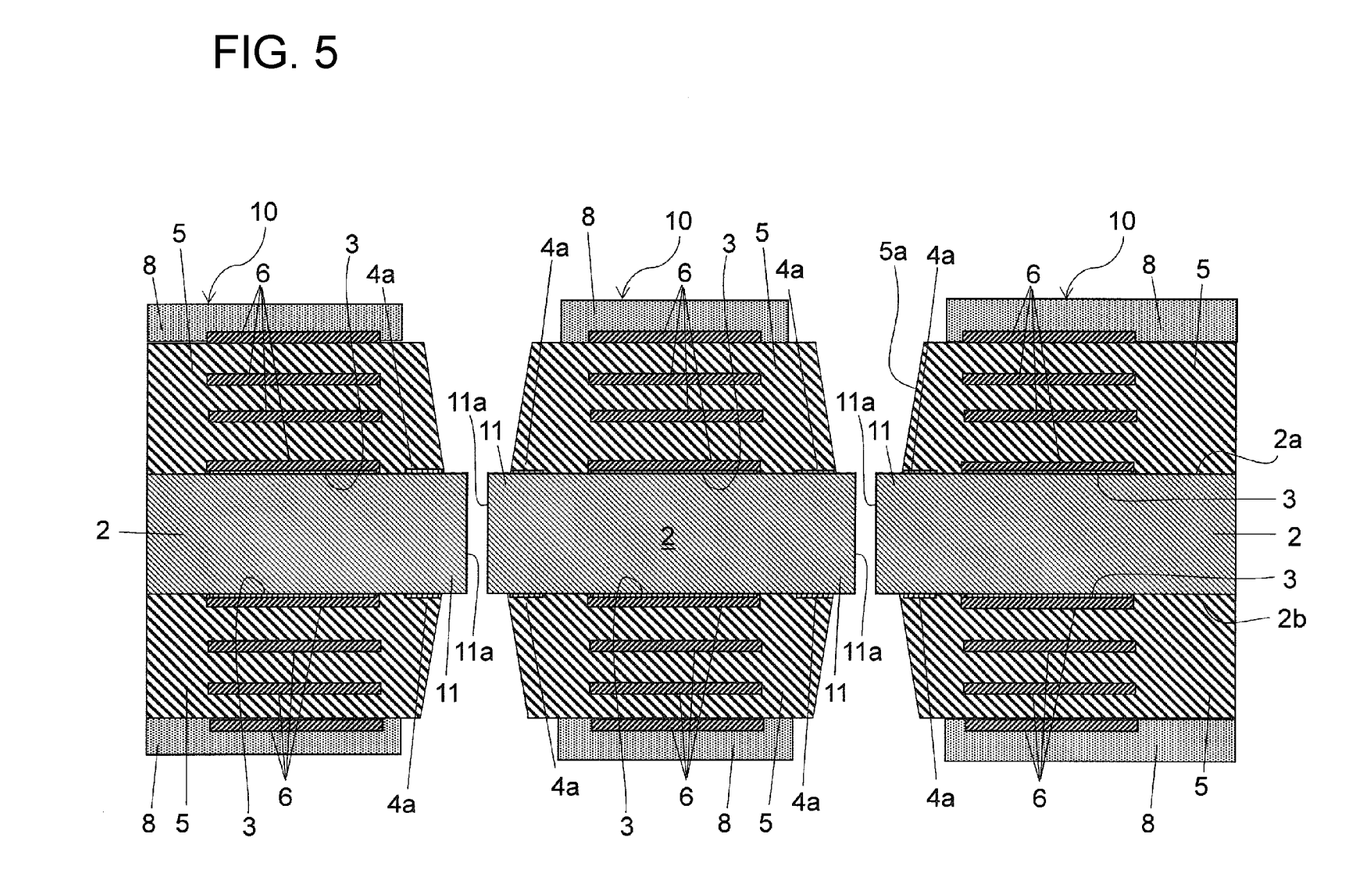
FIG. 5 is a diagram illustrating packaging substrates formed using a method of dicing a wiring substrate, according to an embodiment of the present invention.

As described above, by cutting the wiring substrate 1 into dices at the separation grooves 7, a plurality of packaging substrates 10 shown in FIGS. 5 and 6 are formed.

It should be noted that the front surface 2a or the rear surface 2b of the core substrate 2 corresponds to the core surface of the present invention, and an outer surface 5a of the insulating layer 5 corresponds to the insulating side surface of the present invention.

As shown in FIG. 6, the packaging substrates 10 as formed each have an outer surface, as the outer surface 5a of the insulating layer 5, from which the core substrate 2 protrudes in the width direction to form a core step 11.

The core step 11 protrudes with a predetermined length W4 (termed projection length W4 hereinafter) from an edge portion of the outer surface 5a of the insulating layer 5 closest to the core substrate 2 to a cut surface (termed an end face hereinafter) 11a resulting from dicing.

The packaging substrates 10 that have been diced using the dicing blade 9 tend to suffer from fine cracks occurring in the end faces 11a of the core steps 11.

If each end face 11a is located close to the insulating layers 5 and the wiring layers 6, and the packaging substrate 10 is used under high or low temperature environments, the thermal stress of the insulating layers 5 and the wiring layers 6 may act as a tensile stress on the end face 11a of the core substrate 2 to easily extend the cracks.

In this regard, the packaging substrates 10 of the first embodiment are each provided with the core steps 11 of the core substrate 2 protruding in the width direction from the outer surface 5a of the insulating layers 5. Therefore, each end face 11a of the core step 11 is adequately spaced apart from the insulating layers 5 and the wiring layers 6. Thus, even when the packaging substrates 10 are each used under high or low temperature environments, the thermal stress of the insulating layers 5 and the wiring layers 6 is less likely to act as a tensile stress on the end faces 11a of the core substrate 2, and thus the end faces 11a are less likely to suffer from the occurrence of cracks.

As shown in FIG. 6, near each core step 11, the edges 4a of the rim patterns 4 are respectively adhered and interposed between the front surface 2a of the core substrate and the insulating layer 5 and between the rear surface 2b thereof and the insulating layer 5.

Thus, since each edge 4a of the rim patterns 4 is interposed between the core substrate 2 and the insulating layer 5 near the core step 11, adhesion between the core substrate 2 and the insulating layer 5 improves.

[Advantageous Effects of the Method of Dicing Wiring Substrate, and Advantageous Effects of Packaging Substrate]

The following description explains advantageous effects of the method of dicing the wiring substrate 1 according to the first embodiment.

In the process of forming the separation grooves 7, portions of the insulating layers 5 are removed in the thickness direction of the wiring substrate 1, in which the respective rim patterns 4 are laminated. In this process, each rim pattern 4 is permitted to be partially exposed at the groove bottoms 7a of the respective separation grooves 7, and the edge 4a of the rim pattern 4 that is not exposed at the groove bottoms 7a is permitted to be adhered and interposed between the insulating layer 5 near the groove bottom 7a and the front surface 2a or the rear surface 2b of the core substrate 2. Then, the rim patterns 4 exposed at the groove bottoms 7a of the separation grooves 7 are dissolved and etched away. Then, the wiring substrate 1 is cut into dices using the dicing blade 9 at center positions of the groove bottoms 7a of the respective grooves 7 in the width direction. Through these processes, packaging substrates 10 having accurate external dimensions can be formed.

When the separation grooves 7 are formed by laser radiation in the method of dicing the wiring substrate 1, the rim patterns 4 residing at the groove bottoms 7a can contribute to minimizing damage that would otherwise be caused by the laser radiation on the front surface 2a and the rear surface 2b of the core substrate 2.

The core substrate 2 made of glass and configuring the wiring substrate 1 of the first embodiment enables formation of wiring layers 6 with finer wiring or higher density compared, for example, to a core substrate made of a resin. Such a core substrate 2 has a thermal expansion coefficient that is approximate to those of semiconductor chips and thus can minimize positional displacement at the time of primary mounting due to difference in thermal expansion. Furthermore, a core substrate 2 made of glass can reduce cost compared to silicon substrates or the like.

Advantageous effects of the packaging substrate 10 according to the first embodiment will be described.

The packaging substrates 10 tend to suffer from fine cracks occurring in the end faces 11a of the core steps 11, i.e. in the cut surfaces resulting from dicing.

In this regard, the packaging substrates 10 of the first embodiment are each provided with the core steps 11 of the core substrate 2 protruding in the width direction with the protrusion length W4 from the respective outer surfaces 5a of the insulating layers 5. Therefore, each end face 11a of the core step 11 is adequately spaced apart from the insulating layers 5 and the wiring layers 6. Thus, even when the packaging substrates 10 are each used under high or low temperature environments, the thermal stress of the insulating layers 5 and the wiring layers 6 is less likely to act as a tensile stress on the end faces 11a of the core substrate 2, and thus the end faces 11a are less likely to suffer from the occurrence of cracks. Consequently, high quality packaging substrates 10 can be formed.

Furthermore, near each core step 11, the edge 4a of each rim pattern 4 is interposed between the front surface 2a of the core substrate 2 and the insulating layer 5, or between the rear surface 2b thereof and the insulating layer 5. Therefore, adhesion may improve between the core substrate 2 and the insulating layer 5, which may enable formation of packaging substrates 10 having even higher quality.

Accordingly, there is provided a packaging substrate 10 of higher reliability which does not suffer from cracks or the like occurring in the end faces 11a of the core steps 11 even when used under high or low temperature environments.

Furthermore, when a core substrate 2 with a thickness of 300 μm is provided with a laminate of an insulating layer 5 and wiring layers 6 on each surface thereof, and the wiring board 1 thus obtained is diced so that each core step 11 will have a protrusion length W4 of 50 μm or more, the end faces 11a of the steps 11 are ensured not to be affected by the thermal stress of the insulating layers 5 and the wiring layers 6. Consequently high quality packaging substrates 10 can be formed. A protrusion length W4 of 50 μm or less is not preferable because tensile stress caused by the insulating layers 5 and the wiring layers 6 may be concentrated on the end faces 11a of the core substrate 2 and may damage the core substrate 2. The upper limit is not particularly defined. As long as the upper limit is determined within a range tolerated by the product design, the end faces 11a of the core substrate of the present embodiment can be prevented from being damaged.

When the edge 4a of each rim pattern 4 has an adhesion length W5 of 10 μm or more, being interposed and adhered, near each core step 11, between the front surface 2a of the core substrate 2 and the insulating layer 5 or between the rear surface 2b thereof and the insulating layer 5, adhesion between each insulating layer 5 and the core substrate 2 may improve, thereby reducing the occurrence of cracks in the core substrate 2 due to generation of stress. As long as the adhesion length W5 is 5 μm or more, the advantageous effects of improving adhesion of the present embodiment may be achieved. However, the adhesion length W5 may preferably be 10 μm or more from the viewpoint of designing the groove widths W1 and W2 in terms of positional displacement and variation in processing. The upper limit is not particularly defined. As long as the upper limit is determined within a range tolerated by the product design, the adhesion of the present embodiment can be achieved.

Furthermore, if at least the front surface 2a or the rear surface 2b is exposed at the core steps 11, i.e. in the absence of the rim pattern 4 from at least the front surface 2a or the rear surface 2b of the core steps 11, the end faces 11a of the core steps 11 are prevented from being damaged by the thermal stress of the insulating layers 5 and the wiring layers 6. Consequently, high quality packaging substrates 10 can be formed.

Example 1

Next, examples of the present invention will be described.

First, a wiring substrate 1 was formed using the following process.

As a material for the core substrate 2, aluminosilicate glass with a thickness of 300 μm was used.

The front surface 2a and the rear surface 2b of this core substrate 2 were respectively Ti- and Cu-sputtered to form adhesive layers 3, i.e. laminated films, each having a thickness of 0.4 μm, followed by copper electroplating using the adhesive layers 3 as seed layers to form respective wiring layers 6 each having a thickness of 10 μm.

Then, prior to etching the seed layers, photosensitive resist patterns each having a width of 250 μm were formed on the front surface 2a and the rear surface 2b of the core substrate 2 on which separation grooves 7 were to be formed, followed by etching the seed layers to form respective wiring layers 6, and respective 250-μm width (W6 of FIG. 6) rim patterns 4.

After laminating each wiring layer 6 on the core substrate 2, an insulating material which was an epoxy-containing resin with a linear expansion coefficient of 23 ppm/K was vacuum laminated at 100° C. to form an insulating layer 5. Then, formation of a wiring layer 6 and an insulating layer 5 was iterated to produce laminates each having four wiring layers 6 and three insulating layers 5 respectively on the front and rear surfaces 2a and 2b of the core substrate 2.

For patterning the wiring layers 6 formed by copper plating, a semi-additive method was used. When forming the rim patterns 4, copper-electroplated layers do not have to be necessarily formed. If copper-electroplated layers are formed, the thicknesses of the copper plates are controlled when performing etching after forming the separation grooves 7.

Then, the wiring substrate 1 formed as described above was diced as follows to form packaging substrate 10.

First, separation grooves 7 were formed in the thickness direction of the wiring substrate 1, i.e. toward the respective laminated rim patterns 4, so that each of the rim patterns 4 was partially exposed at the groove bottoms 7a. Each separation groove 7 had a groove width W1 of 390 μm at the opening of the insulating layer 5, and a groove width W2 of 250 μm at the groove bottom 7a.

Then, a solder resist layer 8 was formed on each surface of the wiring substrate 1, avoiding the separation grooves 7.

Then, the wiring substrate 1 was diced using a dicing blade 9 with a cutting margin W3 of 150 μm at respective centers of widths of the separation grooves 7, thereby forming a plurality of packaging substrates 10.

The formed packaging substrates 10 each were parallelopiped with a size of 10 mm×10 mm in plan view. Each packaging substrate 10 had steps 11 of the core substrate 2, each protruding in the width direction from the outer surface 5a of the insulating layers 5 with a set protrusion length W4 of 50 μm. Also, the edges 4a of the respective rim patterns 4, each of which was interposed between the core substrate 2 and the insulating layer 5, each had a set adhesion length W5 of 10 μm.

The packaging substrates 10 each having a structure set forth above were subjected to 1,000 cycles of MIL-STD-883H test with temperature variations of 125° C. to −55° C. As a result, no cracks or the like occurred in the core substrates 2. Thus, packaging substrates 10 of higher reliability were provided.

REFERENCE SIGNS LIST

1 . . . Wiring substrate; 2 . . . Core substrate; 3 . . . Adhesive layer; 4 . . . Rim pattern; 4a . . . Edge of rim pattern; 5 . . . Insulating layer; 5a . . . Outer surface of insulating layer; 6 . . . Wiring layer; 7 . . . Separation groove; 7a . . . Groove bottom; 8 . . . Solder resist layer; 9 . . . Dicing blade; 10 . . . Packaging substrate; 11 . . . Core step; 11a . . . End face of core step; W1 . . . Groove width at the opening of insulating layer 5; W2 . . . Groove width at the bottom of separation groove; W3 . . . Cutting margin; W4 . . . Protrusion length of core step; W5 . . . Adhesion length; W6 . . . Width of rim pattern.

What is claimed is:

1. A packaging substrate, comprising:
a core substrate having at least one core surface on which an adhesive layer and a rim pattern are formed, the adhesive layer being provided with a laminate that has at least one wiring layer and at least one insulating layer, laminating, the rim pattern being provided with the insulating layer laminated thereon,
the packaging substrate has outer surfaces in the width direction thereof, each comprising:
an insulating side surface of the insulating layer; and
a core step protruding in the width direction from the insulating side surface and including an end face of the core substrate, wherein the core substrate is selected from a silicon substrate, a ceramic substrate and a glass substrate.

2. The packaging substrate of claim 1, wherein the core step has a protrusion length set to 50 μm or more from the insulating side surface to the end face.

3. The packaging substrate of claim 1, wherein the rim pattern interposed between the insulating layer and the core surface has a length of 10 μm or more from the insulating side surface.

4. The packaging substrate of claim 1, wherein the core surface of the core step is exposed.

5. The packaging material of claim 1, wherein the core substrate is a glass substrate.

6. The packaging material of claim 1, wherein each of the adhesive layer and the rim pattern is a film comprising Ti, Cr, Ni, Cu or an alloy thereof, or a metallic peroxide.

7. The packaging material of claim 1, wherein the core substrate has a first core surface and a second core surface, which is opposite to the first core surface, wherein each of the first core surface and the second core surface has an adhesive layer and a rim pattern.

8. The packaging material of claim 1, wherein the insulating layer is in direct physical contact with a portion of the core surface of the core substrate.

9. The packaging material of claim 1, wherein the insulating side surface has a slope so that a width of the insulating layer increases towards the core substrate.

10. A packaging substrate, comprising:
a core substrate having at least one core surface on which an adhesive layer and a rim pattern are formed, the adhesive layer being provided with a laminate that has at least one wiring layer and at least one insulating layer, laminating, the rim pattern being provided with the insulating layer laminated thereon,
the packaging substrate has outer surfaces in the width direction thereof, each comprising:
an insulating side surface of the insulating layer; and
a core step protruding in the width direction from the insulating side surface and including an end face of the core substrate, wherein each of the adhesive layer and the rim pattern is a film comprising Ti, Cr, Ni, Cu or an alloy thereof, or a metallic peroxide.

11. The packaging material of claim 10, wherein the core step has a protrusion length set to 50 μm or more from the insulating side surface to the end face.

12. The packaging substrate of claim 10, wherein the rim pattern interposed between the insulating layer and the core surface has a length of 10 μm or more from the insulating side surface.

13. The packaging substrate of claim 10, wherein the core surface of the core step is exposed.

14. The packaging material of claim 10, wherein the core substrate is a glass substrate.

15. The packaging material of claim 10, wherein the insulating layer is direct physical contact with a portion of the core substrate.

16. The packaging material of claim 10, wherein the insulating side surface has a slope so that a width of the insulating layer increases towards the core substrate.

17. A packaging substrate, comprising:
a core substrate having a first core surface and a second core surface, which is opposite to the first core surface, each of the first core surface and the second core surface having an adhesive layer and a rim pattern, the adhesive layer on each of the first core surface and the second core surface being provided with a laminate that has at least one wiring layer and at least one insulating layer, laminating, the rim pattern on each of the first core surface and the second core surface being provided with the insulating layer laminated thereon,
the packaging substrate has outer surfaces in the width direction thereof, each comprising:
an insulating side surface of the insulating layer on each of the first core surface and the second core surface; and
a core step protruding in the width direction from the insulating side surface and including an end face of the core substrate.

18. The packaging material of claim 17, wherein each of the adhesive layer and the rim pattern on each of the first core surface and the second core surface is a film comprising Ti, Cr, Ni, Cu or an alloy thereof, or a metallic peroxide.

19. The packaging material of claim 17, the insulating side surface of the insulating layer on each of the first core surface and the second core surface has a slope so that a width of the corresponding insulating layer increases towards the core substrate.

20. The packaging material of claim 17, wherein the core substrate is a glass substrate.

\* \* \* \* \*